US006617932B2

(12) United States Patent
Kushner et al.

(10) Patent No.: US 6,617,932 B2
(45) Date of Patent: Sep. 9, 2003

(54) SYSTEM AND METHOD FOR WIDE DYNAMIC RANGE CLOCK RECOVERY

(75) Inventors: Lawrence J. Kushner, Andover, MA (US); Hemonth Rao, Burlington, MA (US)

(73) Assignee: AXE, Inc., Maynard, MA (US)

( * ) Notice: Subject to any disclaimer, the term of this patent is extended or adjusted under 35 U.S.C. 154(b) by 0 days.

(21) Appl. No.: 09/939,852

(22) Filed: Aug. 27, 2001

(65) Prior Publication Data

US 2003/0038682 A1 Feb. 27, 2003

(51) Int. Cl.[7] .............................................. H03L 7/00
(52) U.S. Cl. .......................... 331/11; 331/12; 375/327; 375/376
(58) Field of Search ............................. 331/11, 12, 74; 375/327, 376

(56) References Cited

U.S. PATENT DOCUMENTS

| | | | | |
|---|---|---|---|---|
| 3,815,042 A | * | 6/1974 | Maunsell et al. | 331/11 |
| 4,297,650 A | * | 10/1981 | Shinmyo | 331/11 |
| 4,365,211 A | * | 12/1982 | Lee | 331/11 |
| 4,481,484 A | * | 11/1984 | Campbell | 331/12 |
| 5,574,406 A | * | 11/1996 | Sauer et al. | 331/11 |
| 5,666,388 A | * | 9/1997 | Neron | 331/11 |
| 6,308,048 B1 | * | 10/2001 | Gore et al. | 455/76 |
| 6,356,157 B1 | * | 3/2002 | Kawamura | 331/11 |
| 6,356,158 B1 | * | 3/2002 | Lesea | 331/11 |

OTHER PUBLICATIONS

Gardner, Ph.D, Floyd M., "Phaselock Techniques," 1979, John Wiley & Sons, pp. 1–32 and 214–220.

* cited by examiner

Primary Examiner—Michael Tokar
Assistant Examiner—Khai M Nguyen
(74) Attorney, Agent, or Firm—Mills & Onello, LLP

(57) ABSTRACT

A system and method for clock recovery from an input data stream recovers the clock signal in a manner that preserves the signal strength of the input signal. The measure of signal strength, referred to herein as the "signal strength indicator" is in turn used to normalize the output of a phase detector in a phaselocked loop (PLL), and the normalized signal is used as an input to the PLL oscillator to recover the clock signal from the input data signal. In this manner, the phaselocked loop is used to perform narrow band filtering, while baseband amplifiers are used to compensate for reference signal power variations. In one aspect, the present invention is directed to a clock recovery system for recovering a clock signal from an input data signal. The system comprises a primary phase detector for receiving an input data signal, and for combining the input data signal with a feedback signal to generate a phase difference signal. An auxiliary phase detector receives the input data signal and combines the input data signal with the feedback signal to generate the signal strength indicator. A gain equalizer normalizes the phase difference signal by the signal strength indicator, and an oscillator provides the clock signal based on the normalized phase difference signal and further provides the clock signal as the feedback signal which is returned to the auxiliary and primary detectors.

74 Claims, 3 Drawing Sheets

SYSTEM AND METHOD FOR WIDE DYNAMIC RANGE CLOCK RECOVERY

BACKGROUND OF THE INVENTION

In contemporary communication systems operating at ever-increasing transmission rates, return-to-zero (RZ) signaling has become a popular method for data exchange. In RZ signaling, a strong component of the clock frequency exists in the data spectrum, providing a reference on which a phaselocked loop (PLL)-based, or filter-based, clock recovery unit (CRU) can latch in order to recover the clock signal from the received data stream. Such PLL-based CRU systems are well-studied and characterized in the technical literature.

At relatively low data transfer rates, a fundamental oscillator is commonly deployed in the PLL, and the recovered clock is obtained directly. In cases where half the clock frequency is desired, for example in demultiplexer applications, a frequency divider is often employed. At higher frequencies, fundamental high-Q oscillators are difficult to build, and are therefore costly, due to the reduction in resonator size. While a frequency doubler can be used, a more compact and relatively low power approach is to employ a harmonic mixer as the phase detector for the phaselocked loop.

In any phaselocked loop application, there are tradeoffs between operation parameters such as phase noise, settling speed, tracking range, stability, loop gain, loop bandwidth, etc. For best performance, an optimum loop transfer characteristic, or combination thereof, can be determined and needs to be maintained. Unfortunately, in some RZ signaling communication systems, the level of the reference tone in the data spectrum can vary over a 10:1 dynamic range, or even more. At the same time, in order to maintain constant and optimal loop performance, this change in signal level cannot be allowed to alter the loop response.

With reference to the schematic block diagram of FIG. 1, a conventional clock recovery unit 50 includes an amplifier 20 and a phaselocked loop 48. The amplifier 20 may comprise, for example, an automatic gain control (agc) amplifier, a linear amplifier, or a limiting amplifier. The received input signal 30, for example in the form of an RZ, or non-return-to-zero (NRZ) serial data stream is amplified by the amplifier 20 and is presented to the phaselocked loop 48. Assuming the amplifier 20 is a limiting amplifier or agc amplifier, the amplifier properties are such that the amplitude variation of the input signal is reduced in the amplified signal 21.

The phaselocked loop 48 includes a phase detector 22, for example in the form of a mixer, an active loop filter 24, and an oscillator 26. The phase detector 22 receives the amplified input signal and a feedback signal 34 and provides a phase difference signal 23 indicative of the difference in phase between the feedback and amplified signals 34, 21. The phase difference signal 23 is filtered by the active loop filter 24, which controls the dynamic performance of the phaselocked loop 48, for example the acquisition and tracking parameters of the phaselocked loop. At high frequencies, the active loop filter 24 typically comprises an analog filter, while at lower signal transfer rates, the active loop filter 24 may comprise a digital filter in the form of a digital signal processor. While an active loop filter is most common, a passive filter, for example in the form of an RCL network is equally applicable. In either case, the filter is optimized to trade off phaselocked loop dynamics including noise performance, stability, pull-in range, and acquisition time. The filtered output signal 25 is presented to an oscillator 26 to adjust the oscillation frequency of the phaselocked loop 48. The oscillator 26 is typically tuned to the expected clock frequency of the input data stream 30. The output of the oscillator 26 is provided as the recovered clock signal 32 and is also fed back via feed back signal 34 to the phase detector 22.

The conventional approach for handling dynamic range variance exhibited by the input data stream is to employ an automatic gain control (agc) amplifier 20 at the reference frequency, for example the RZ carrier frequency, prior to processing by the PLL phase detector 22 as shown in FIG. 1. A number of drawbacks are associated with this approach. First, providing gain at the carrier rate can be expensive and power hungry, for example at the current 20 or 40 GHz RZ signaling rates. Second, if the reference clock tone level varies while the total power in the data spectrum remains constant, the detector in the agc loop will not respond properly, exposing the PLL phase detector to large variations in the tone level. Additionally, due to non-linearities in the phase detector and gain-control elements, a high-gain feedback loop is required to complete the agc circuitry, the dynamic response of which must be carefully optimized.

An alternative approach is to employ a limiting amplifier 20 at the reference frequency for amplifying the received input data steam 30, prior to the PLL phase detector. Although this is the most common approach, it carries with it a number of drawbacks. First, with the entire data spectrum entering into the limiter, rather than a single tone, the limiter, being non-linear, will generate intermodulation products that are likely to appear within the bandwidth of the phaselocked loop. Second, the limiter removes all amplitude information from the processed input signal without providing a signal strength indicator, thereby eliminating a vital error signal source in the RZ system. Additionally, in a poor signal-to-noise environment, the limiter suppresses the desired carrier due to the noise dominating the limiting action.

Another option is to employ a digital phase-frequency detector instead of a balanced mixer phase detector. At the present time, no such digital detectors are available at operation rates above approximately 1.5 GHz. Additionally, such digital systems have associated with them all the drawbacks of the limiter discussed above, creating intermodulation products and stripping amplitude information from the processed input data stream.

Another possibility is to employ a narrow band agc loop at the reference frequency. However, this approach requires a high-Q resonator at the reference frequency, duplicating, to a large degree, the function of the phaselocked loop.

SUMMARY OF THE INVENTION

The present invention is directed to a system and method for clock recovery by which a clock signal is recovered from an input data signal in a manner that preserves the signal strength of the input signal. The measure of signal strength, referred to herein as the "signal strength indicator", is in turn used to normalize the output of the phase detector of the phaselocked loop (PLL), and the normalized signal is used as an input to the PLL oscillator to recover the clock signal from the input data signal. In this manner, the PLL is used to perform narrow band filtering, while relatively inexpensive baseband components are used to compensate for reference signal power variations. The net result is a clock recovery system in which PLL performance remains constant over a wide range of input signal levels, and remains constant with rapidly varying input signal levels. The system is thus more tolerant of transmission link impairments, and can therefore operate at higher data transmission rates and over longer distances.

In one aspect, the present invention is directed to a clock recovery system for recovering a clock signal from an input data signal. The system comprises a primary phase detector for receiving an input data signal, and for combining the input data signal with a feedback signal to generate a phase difference signal. An auxiliary phase detector receives the input data signal and combines the input data signal with the feedback signal to generate the signal strength indicator. A gain equalizer normalizes the phase difference signal by the signal strength indicator, and an oscillator provides the clock signal based on the normalized phase difference signal and further provides the clock signal as the feedback signal which is returned to the auxiliary and primary detectors.

In a preferred embodiment, a first amplifier receives and amplifies the input data signal. The first amplifier preferably comprises a linear amplifier. The input data signal may comprise, for example, a return-to-zero (RZ) signal.

A first splitter may be included for distributing the input data signal to the primary and auxiliary phase detectors. A second splitter may be included for distributing the feedback signal to the primary on auxiliary phase detectors. In a preferred embodiment, the first and second splitters comprise 3 dB splitters.

A filter may be provided for filtering the phase difference signal to control the dynamic performance of the clock recovery system. A temperature compensation unit may be provided for compensating for temperature variance in the system. The temperature compensation unit adjusts the normalized signal phase output signal based on system temperature variance.

The recovered clock signal is preferably presented at an output node. A third splitter distributes the recovered clock signal to the output node as the clock signal and to the primary and auxiliary harmonic mixers as the feedback signal. The third splitter may comprise a 3 dB splitter. A first isolator may be included at an input of the third splitter, and a second isolator at an output of the third splitter that provides the feedback signal, for isolating the system from load variations occurring in a load coupled to the output node, and for preventing corruption of the clock signal by the primary and auxiliary phase detectors.

The gain equalizer preferably comprises a divider for dividing the phase difference signal by the signal strength indicator. The auxiliary phase detector may comprise a harmonic mixer or a combination of a frequency doubler and mixer. A phase shifter may be provided for shifting the phase of the feedback signal to provide a phase-shifted feedback signal to the auxiliary phase detector.

In another aspect, the present invention is directed to a phaselocked loop for locking an output signal to an input signal. A primary phase detector receives an input signal and combines the input signal with a feedback signal to generate a phase difference signal. A gain equalizer normalizes the phase difference signal by a signal strength indicator generated as a function of the signal strength of the input signal. An oscillator provides the output signal based on the normalized phase difference signal and provides the output signal as the feedback signal.

An auxiliary phase detector may be provided for receiving the input data signal and for mixing the input data signal with the feedback signal to generate the signal strength indicator.

In a preferred embodiment, the normalization function is performed at baseband, while the phase detectors and linear input amplifier functions are performed at the carrier band rates.

In this manner, an economical and precise clock recovery system and method are provided. A linear, constant-gain amplifier is employed at the reference frequency, a phase-locked loop is used to perform the narrowband filtering, and a baseband open-loop feed-forward agc is used to compensate for reference and signal power variations. This configuration results in a clock recovery system and method in which PLL performance remains constant over a wide range of input signal amplitude levels, and which preserves information regarding the strength of the clock tone which can be used as an error signal in other circuits controlling other devices and subsystems in the receiver.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
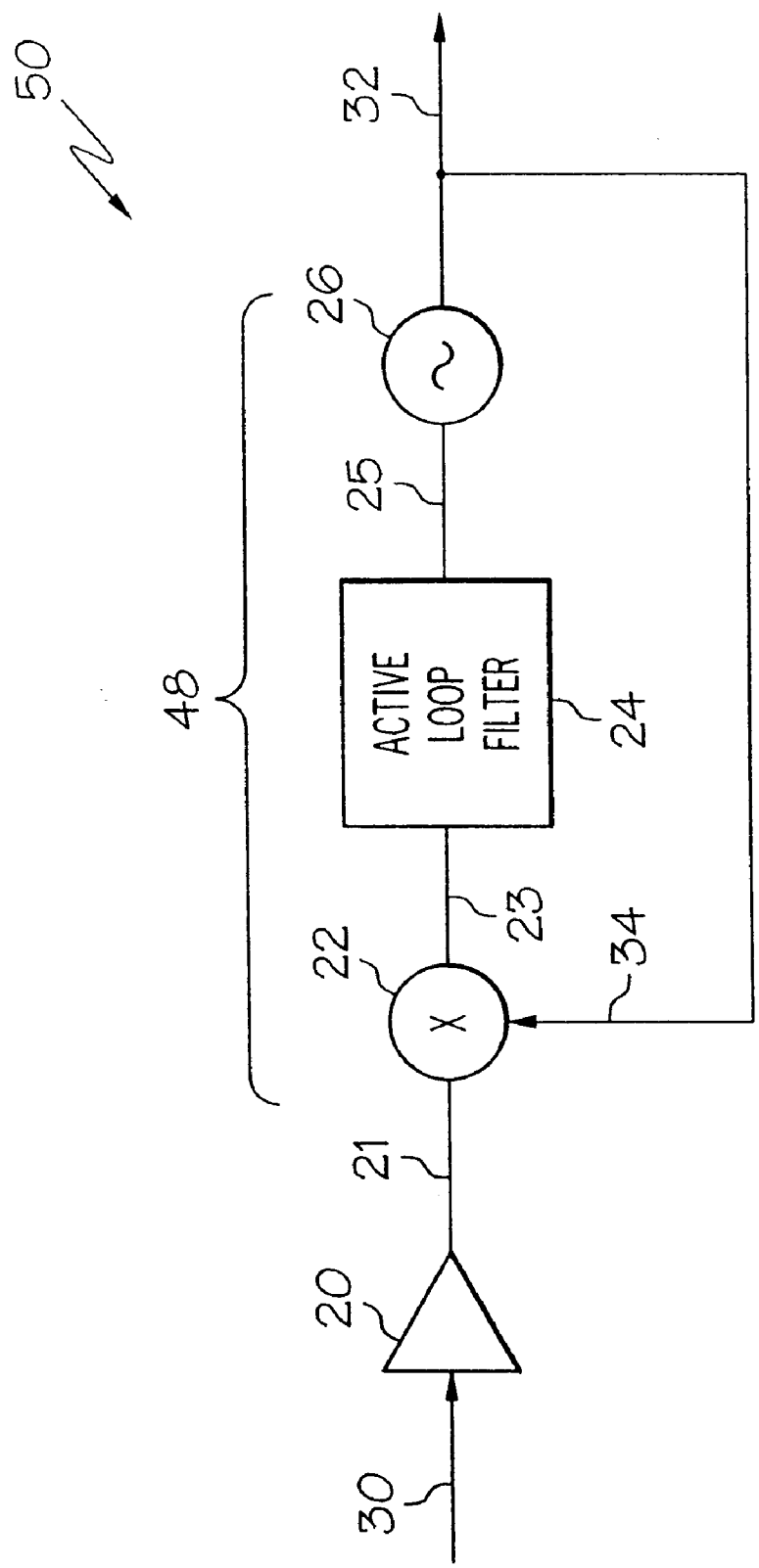
FIG. 1 is a schematic diagram of a conventional phase-locked loop used for clock signal recovery from an input data stream.

The present invention employs linear, constant-gain amplifiers operating at the reference frequency and employs a phaselocked loop to perform narrowband filtering. In a preferred embodiment, a quadrature mixer arrangement is used, in the form of primary and auxiliary phase detectors, where the auxiliary phase detector is used to provide a measure of the input signal strength, referred to herein as the "signal strength indicator". The output of the primary phase detector, in the form of a phase-difference signal, is normalized by the signal strength indicator to a constant level. Through normalization, constant PLL performance is achieved over a wide range of input data signal tone levels. The signal strength indicator can additionally be used as an error signal by other components of the communication system.

In this manner, the system and method of the present invention achieve optimal results and stable response using inexpensive normalization components at baseband, for example, off-the-shelf operational amplifiers and analog multipliers/dividers. This is in contrast with the conventional techniques for compensating for input signal amplitude fluctuations, which employ expensive and complicated microwave circuits for attempting such compensation at the much higher carrier frequencies, to achieve relatively marginal results.

The conventional agc loop employs an rf detector, a gain-control element, and a high-gain operational-amplifier stage configured in a closed loop. As the time-varying signal level on the detector increases, the loop responds by lowering the gain in order to keep the detected signal level equal to a predetermined reference. The conventional approach is not applicable to a baseband phaselocked loop approach, as employed by the present invention, since, when the loop locks, the AC component to be detected disappears and a DC level is present. This DC level is thus no longer an indication of signal strength. Instead, the DC level is set by the phaselocked loop to keep the phaselocked loop in a locked condition.

In contrast, the open-loop agc configuration disclosed herein is operable when the phaselocked loop is locked and only DC levels are present. In order to preserve constant phaselocked loop performance, the open-loop gain control configuration of the present invention must perfectly compensate for input signal level changes without the benefit of a high-gain loop to remove non-linearities. The system and method of the present invention provide for this, by generating a gain control signal in the form of a signal strength indicator which is then applied to a divider, for example an analog divider, and multiplied by the primary phase detector output, which serves to normalize the phase difference signal exactly. This approach is limited in speed only by the speed of the analog multipliers and dividers. No additional high-gain agc loop circuitry is required, and therefore, exposure to the associated dynamics is prevented.

In an alternative embodiment, the process of normalization can occur in the digital domain by digitizing the phase detector outputs performing the normalization, and then converting back to the analog domain using digital-to-analog converters. However, the entirely analog approach discussed herein as the preferred embodiment provides a simple, low-power solution that mitigates the introduction of spurious noise into the phaselocked loop. The analog approach further offers highly reduced latency, allowing it to be employed with higher loop bandwidths, while maintaining stable operation.

Figure 2:
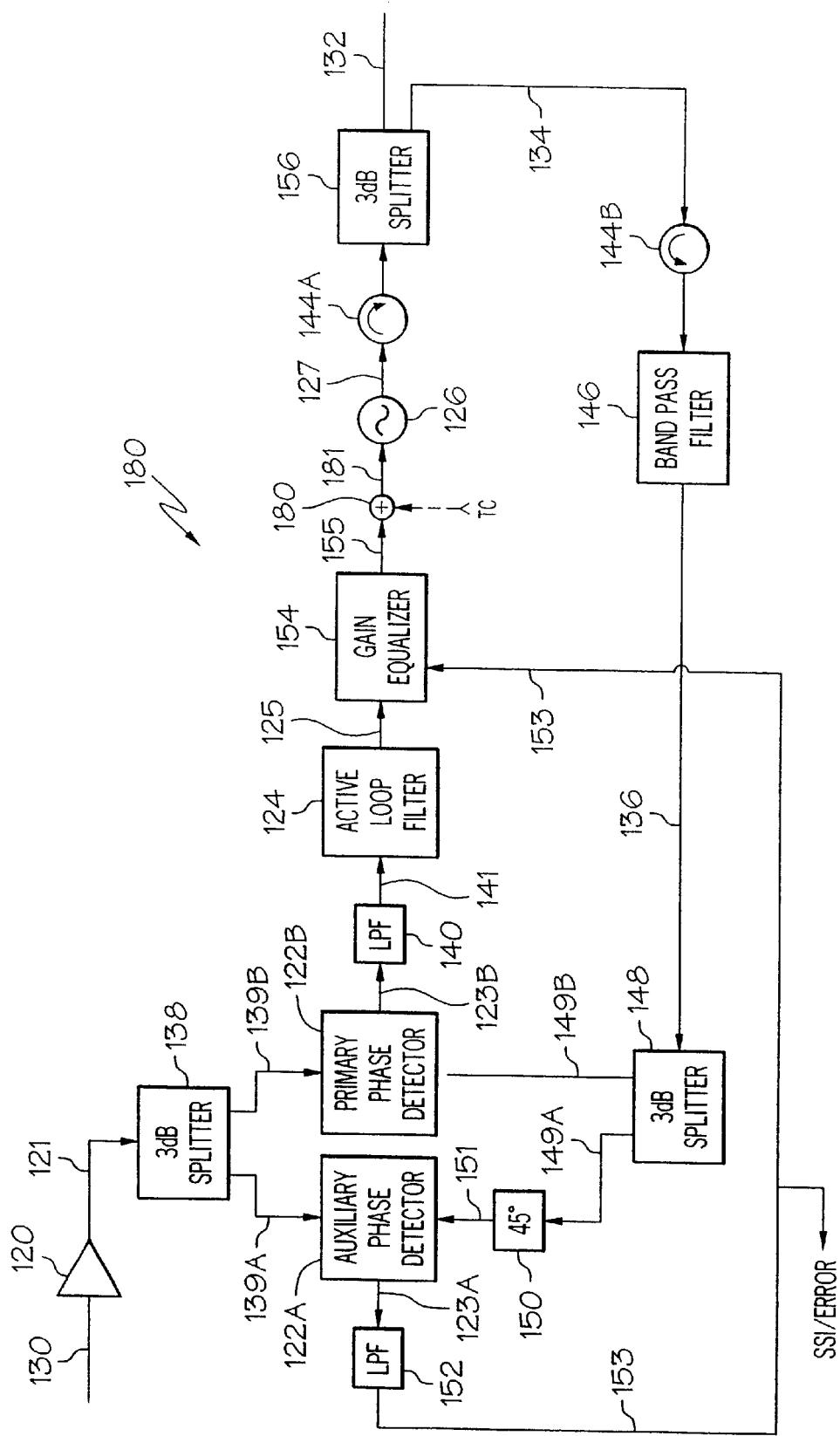
FIG. 2 is a schematic diagram of a clock recovery system in accordance with the present invention.

FIG. 2 is a schematic block diagram of a preferred embodiment of the system of the present invention. An input data signal is received at input terminal 130. The input data signal may, for example, take the form of a high-bandwidth serial data stream, for example, a 21.32 GHz optical data stream composed, for example, of non-return-to-zero (NRZ) or return-to-zero (RZ) signal pulses. The data pulses are transmitted by a remote transmitter using a clock as a synchronization source, and propagate through the transmission medium to the receiver. The receiver receives the data pulses without the clock pulse, and thus clock recovery techniques are employed to take advantage of the clock component inherent in the data pulses to extract the clock signal from the received data stream.

The input data signal is amplified by linear amplifier 120. The linear amplifier does not limit the amplitude of the resulting amplified signal 121, but instead, retains the input signal strength information in the amplified signal 121 that is presented to the phaselocked loop 180. The linear amplifier may comprise a microwave amplifier hybrid, for example formed of microwave transistors and passive components, or may comprise a monolithic microwave integrated circuit (MMIC) or IC-based amplifier. Since filtering is performed at baseband, both broadband amplifiers and narrowband amplifiers can be used for the linear amplifier, whichever option is the most convenient or practical for a given application.

The phaselocked loop 180 of the present invention comprises a primary phase detector 122B, an active loop filter 124, a gain equalizer, 154, an oscillator 126, a phase shifter 150, first, second and third splitters 138, 148, 156, a low-pass filter 152, 140, a bandpass filter 146, and isolators 144A, 144B. An auxiliary phase detector 122A and associated low pass filter 152 in combination with the gain equalizer 154 form an open-loop feed-forward gain equalizer leg for effecting the normalization operation, discussed in farther detail below.

The amplified input signal 121, is presented to, and split by, the first splitter 138, in the form of a 3 dB splitter 138. The first 3 dB splitter splits the amplified input signal 121 into an auxiliary input signal 139A and a primary input signal 139B, of approximately equal power.

The primary input signal 139B is processed by the primary phase detector 122B, which, for example, may comprise a mixer. The primary phase detector 122B also receives a primary feedback signal 149B from the output of the phaselocked loop (discussed below). The mixer of the phase detector effectively provides the function of multiplying signals in the time domain, which equates to convolution in the frequency domain. In this manner, the output of the phase detector is a signal that is a function of the phase difference between the primary input signal 139B and the primary feedback signal 149B. This output signal is referred to herein as the "phase difference signal" 123B.

In an application where the frequency of the eventual recovered clock output is to be a fraction of, or multiple of, the frequency of the input data signal, a frequency multiplier or frequency divider respectively may be applied to the mixer. For example, in the case of an optical demultiplexer where the input data signal is at a transfer rate of 21.3 GHz, and the recovered clock signal is at a rate of 10.66 GHz, frequency doublers may be employed at the mixers of the primary and auxiliary phase detectors 122B, 122A. The frequency multiplier and mixer components are commonly combined in the art as a single unit and referred as a "harmonic mixer".

The auxiliary input signal 139A is processed by the auxiliary phase detector 122A, which, in a preferred embodiment, comprises a mixer, as described above. The auxiliary phase detector 122A mixes the auxiliary input signal 139A with a phase-shifted auxiliary feedback signal 151, to provide an output signal referred to herein as a "signal strength indicator" signal 123A. The phase-shifted auxiliary feedback signal 151 is generated by phase shifter 150, which, in the case of the preferred embodiment, provides a 45 degree phase shift of the auxiliary feedback signal 149A. The auxiliary feedback signal 149A is the same signal as the primary feedback signal 149B, by virtue of the second 3 dB splitter 148. The combination of the 45 degree phase shifter 150 with a 2X harmonic mixer of the auxiliary phase detector results in a 90 degree phase shift, and is therefore referred to in the art as a "quadrature mixer", and is employed in the preferred embodiment of the present invention. The output signal strength indicator signal 123A is a signal that is a function of the amplitude of the input signal 130, by virtue of the phase shift of the auxiliary feedback signal 149A.

The signal strength indicator 123A is filtered by low pass filter 152, for example comprising a capacitor, for eliminating sum frequencies from the signal and for passing the DC information in the signal. The resulting filtered signal strength indicator signal 153 is fed forward to the gain equalizer, where it is used to normalize the phase difference signal 123B of the phaselocked loop. The signal strength indicator signal 153 may be further distributed as an error signal SSI/ERROR to be used other receiver subsystems.

The effect of the normalization is to make the performance of the phaselocked loop insensitive to input signal amplitude. The normalization approach of the present invention recognizes that the output of the primary phase detector 141 is proportional to the input signal level multiplied by the sine of the difference in phase between the primary input signal 139B and the primary feedback signal 149B. Similarly, due the phase shift, the output of the auxiliary phase detector 153 is proportional to the input signal level multiplied by the cosine of the difference in phase between the auxiliary input signal 139A and the phase-shifted auxiliary feedback signal 151. The feed-forward gain equalizer divides the output of the primary phase detector 141 (following filtering at filter 124) by the output of the auxiliary phase detector 153, and therefore cancels out, or effectively removes, the dependence on input signal level. The output of the gain equalizer 155 is thus proportional to the tangent of the difference in phase between the input signal and feedback signal, which, for small phase differences, approximates to the phase difference itself. In this manner, the system and method of the present invention result in a recovered clock signal that is proportional to phase variations of the input signal, in a manner that is effectively independent of input signal level variations.

The phase difference signal 123B, output by the primary phase detector 122B, is processed by low pass filter 140 (it is possible for the functions of the phase detector 122B and the low pass filter 140 to be combined), and the output signal 141 is presented to the active loop filter 124. The active loop filter 124 controls the dynamic performance of the phaselocked loop, for example acquisition and tracking. The filter 124 may include a combination of analog components, for example operational amplifiers and R-C-L networks in an active configuration, and/or purely R-C-L networks in a passive configuration. Alternatively, the filtering may be performed in the digital domain, for example, converted from an analog to a digital signal, filtered by digital signal processor (DSP) and converted back to an analog signal. In either case, the filter tradeoffs include loop dynamics, noise performance, loop stability, and loop balance. Such filters 124 are well documented in the technical literature.

The resulting filtered phase difference signal 125 is input to the gain equalizer 154, which operates to normalize the filtered phase difference signal 125 by the signal strength indicator signal 153, fed forward by the auxiliary phase detector 122A.

Figure 3A:
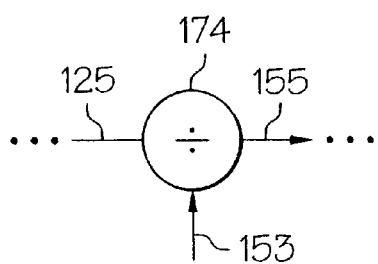
FIGS. 3A–3C are schematic diagrams of gain equalizer embodiments for normalizing the phase difference signal by the signal strength of the incoming data stream, in accordance with the present invention.
Figure 3B:
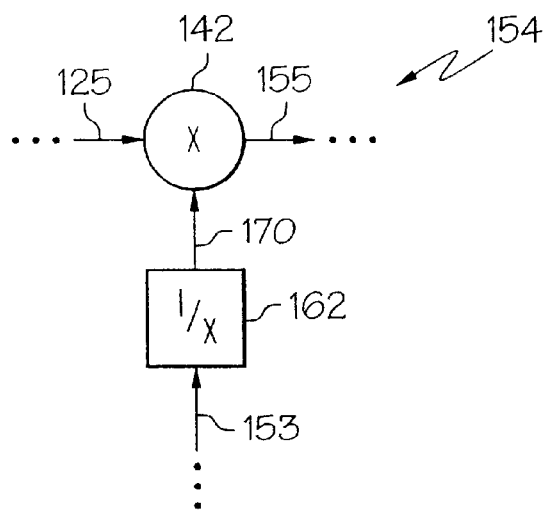
Figure 3C:
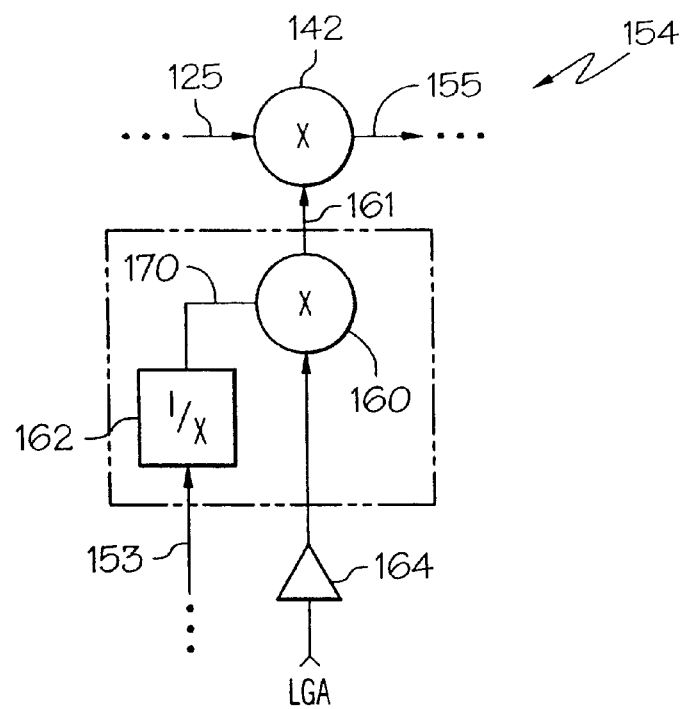

In a preferred embodiment, normalization takes the form of a division operation. For example, the filtered phase difference signal 125 is divided by the signal strength indicator signal 153. With reference to FIGS. 3A–3C, various embodiments are disclosed for performing this operation. Other embodiments for performing the division operation are equally applicable. In FIG. 3A, the filtered phase difference signal 125 is divided by the signal strength indicator signal 153 at divider 174 to generate the normalized output signal 155. In FIG. 3B, the signal strength indicator signal 153 is input to inverse operation 162 which performs a 1/X, or reciprocal, operation on the input signal. The signal strength indicator signal 153 is thus moved to the denominator of the operation at signal 170, which is in turn multiplied with the filtered phase difference signal 125 at multiplier 142. The normalized output signal 155 is output to the phase locked loop 180.

In FIG. 3C a second multiplier 160 is added to accommodate an optional loop-gain adjustment signal LGA, which, for example, can be used to modify the loop gain, and hence the dynamic performance of the phaselocked loop. The loop-gain adjustment signal LGA is buffered by buffer 164 and multiplied by signal 170 at the second multiplier 160. The adjusted signal 161 is multiplied by the filtered phase difference signal 125 at multiplier 142 to provide the normalized output signal.

The normalized phase difference signal 155 is next combined with an optional temperature compensation signal TC at adder 180. The temperature compensation signal TC may be in the form of, for example, a DC signal that is generated as a function of varying system operational temperature. The temperature may be sensed, for example, by thermistors, and the sensed signal converted and processed by a DSP, to provide a suitable DC level for the TC signal.

The resulting adjusted, filtered phase difference signal 181 is next input to an oscillator 126, where the signal 181, for example a DC-level signal is input to a voltage-controlled oscillator (VCO) or current-controlled oscillator comprising the oscillator 126, and is used to adjust the oscillation frequency, based on the DC level of the signal. In the present embodiment, the oscillation frequency of the oscillator is tuned to half of the expected clock frequency of the input data stream, for example 10.66 GHz. The output of the oscillator is the recovered clock signal 127.

The recovered clock signal 127 is provided at the output terminal 132 and is also fed back to the primary and auxiliary phase detectors 122B, 122A as feedback signal 134. A third 3 dB splitter 156 provides each of these signals. Optional first and second isolators 144A and 144B are coupled to the input of the third splitter and the feedback branch of the output of the third splitter 156. The first isolator 144A isolates the operation of the phaselocked loop from load variations in a load coupled to the output terminal. The second isolator prevents the spectral content of the input data stream that passes through the mixers of the primary and auxiliary phase detectors 122B, 122A, from corrupting the output signal 132. The isolators 144A, 144B are preferably non-reciprocal devices, for example taking the form of microwave amplifiers, or magneto-ferrite-based devices.

The feedback signal 134 passes through the second isolator 144B, and is filtered by bandpass filter 146. The bandpass filter prevents data noise from flowing in the reverse direction, and further strips harmonics that may have been generated by the oscillator 126, to prevent the harmonics from causing a DC-level shift at the outputs of the auxiliary and primary phase detectors 122A, 122B.

The filtered feedback signal 136 is split at the second 3 dB splitter 148 and divided into the equivalent primary feedback signal 149B, and auxiliary feedback signal 149A. As explained above, the primary feedback signal 149B is provided to the primary phase detector 122B and mixed with the primary amplified input signal 139B to generate the phase difference signal 123B. At the same time, the auxiliary feedback signal 149A is phase-shifted at phase shifter 150, and the phase-shifted signal 151 is provided to the auxiliary phase detector 122A, where it is mixed with the amplified auxiliary input signal 139A, to generate the signal strength indicator signal 123A.

In the example embodiment described above, the received input data stream 130 is at a transmission rate twice that of the oscillator 126, and desired output clock rate 127. For this reason, 2X harmonic mixers are employed in the primary and auxiliary phase detectors 122B, 122A. Since a 2X harmonic mixer is employed in the auxiliary phase detector 122A, a 45 degree shift is needed in the phase shifter. Assuming a non-harmonic mixer is employed by the auxiliary phase detector 122A, a 90 degree shift in the phase shifter would be necessary.

It should be noted that although the phase shift is shown on the auxiliary leg of the feedback path, other embodiments are possible, and equally applicable, to the principles of the present invention. Any embodiment that would place the signals presented to the mixers of the primary and auxiliary phase detectors 122B, 122A in quadrature, i.e. shifted by 90 degrees in phase, would be applicable.

In addition, the present invention performs the normalization operation at baseband. In this manner, a narrow, high-Q filter is provided using baseband components. This effectively places a high-Q filter around the carrier, i.e. clock, frequency by translating the carrier frequency spectrum down to baseband. This is in contrast with conventional approaches which implement the high-Q filter at the carrier frequency, for example in the form of a narrowband feedback amplifier/filter operating at the carrier frequency rate. In this manner, the present invention provides the effect of narrowband filtering without the need for, and expense of, building a narrowband filter. In addition, the present invention provides a high-Q filter rating that would otherwise not be achievable in contemporary microwave techniques.

While this invention has been particularly shown and described with references to preferred embodiments thereof, it will be understood by those skilled in the art that various changes in form and details may be made herein without departing from the spirit and scope of the invention as defined by the appended claims.

For example, while the primary and auxiliary phase detectors are described above as including mixers, other implementations of phase detectors are well known and equally applicable. These include digital XOR gates and flip-flop configurations that serve as phase frequency comparators.

In addition, generally, at relatively low frequencies, for example in the gain equalizer 154, multipliers are used to process signals, while at high frequencies, for example in the primary and auxiliary phase detectors 122B, 122A, mixers are used. Both multipliers and mixers apply equally well to the principles of the present invention, and thus the two terms are defined herein to be used interchangeably.

We claim:

1. A clock recovery system for recovering a clock signal from an input data signal comprising:
   a primary phase detector for receiving an input data signal, and for combining the input data signal with a feedback signal to generate a phase difference signal;
   an auxiliary phase detector for receiving the input data signal, and for combining the input data signal with the feedback signal to generate a signal strength indicator that is a function of the amplitude of the input data signal;
   a gain equalizer for normalizing the phase difference signal by the signal strength indicator; and
   an oscillator for providing the clock signal based on the normalized phase difference signal, and for providing the clock signal as the feedback signal.

2. The system of claim 1 further comprising a first amplifier for receiving and amplifying the input data signal.

3. The system of claim 2 wherein the first amplifier comprises a linear amplifier.

4. The system of claim 1 wherein the input data signal is a return-to-zero (RZ) signal.

5. The system of claim 1 further comprising a first splitter for distributing the input data signal to the primary and auxiliary phase detectors.

6. The system of claim 5 wherein the first splitter is a 3 dB splitter.

7. The system of claim 1 further comprising a second splitter for distributing the feedback signal to the primary and auxiliary phase detectors.

8. The system of claim 7 wherein the second splitter is a 3 dB splitter.

9. The system of claim 1 further comprising a filter for filtering the phase difference signal to control dynamic performance of the clock recovery system.

10. The system of claim 1 further comprising a temperature compensation unit for compensating for temperature variance in the system.

11. The system of claim 10 wherein the temperature compensation unit adjusts the normalized signal phase output signal based on the temperature variance.

12. The system of claim 1 further comprising an output coupled to the recovered clock signal.

13. The system of claim 12 further comprising a third splitter for distributing the recovered clock signal to the input as the clock signal and to the primary and auxiliary phase detectors as the feedback signal.

14. The system of claim 13 wherein the third splitter is a 3 dB splitter.

15. The system of claim 13 further comprising a first isolator at an input of the third splitter and a second isolator at an output of the splitter providing the feedback signal, for isolating the system from load variations in a load coupled to the output, and for preventing corruption of the clock signal by the primary and auxiliary phase detectors.

16. The system of claim 1 wherein the gain equalizer comprises a divider for dividing the phase difference signal by the signal strength indicator.

17. The system of claim 16 wherein the divider comprises a reciprocal unit for generating a reciprocal of the signal strength indicator and a first multiplier for multiplying the reciprocal of the signal strength indicator by the phase difference signal.

18. The system of claim 17 wherein the divider further comprises a second multiplier for multiplying the signal strength indicator or the reciprocal of the signal strength indicator by a gain adjustment signal.

19. The system of claim 1 wherein the auxiliary phase detector comprises one of a harmonic mixer, or frequency doubler and mixer.

20. The system of claim 1 further comprising a phase shifter for shifting the phase of the feedback signal to provide a phase-shifted feedback signal to the auxiliary phase detector.

21. The system of claim 1 wherein the signal strength indicator is distributed as an error signal to other system components.

22. A phaselocked loop for locking an output signal to an input signal comprising:
   a primary phase detector for receiving an input signal, and for combining the input signal with a feedback signal to generate a phase difference signal;
   a gain equalizer for normalizing the phase difference signal by a signal strength indicator generated as a function of the amplitude of the input signal; and
   an oscillator for providing the output signal bused on the normalized phase difference signal, and for providing the output signal as the feedback signal.

23. The phaselocked loop of claim 22 further comprising an auxiliary phase detector for receiving the input data signal, and for mixing the input data signal with the feedback signal to generate the signal strength indicator.

24. The phaselocked loop of claim 22 wherein the auxiliary phase detector comprises one of a harmonic mixer, or frequency doubler and mixer.

25. The phaselocked loop of claim 24 further comprising a phase shifter for shifting the phase of the feedback signal to provide a phase-shifted feedback signal to the auxiliary phase detector.

26. The phaselocked loop of claim 22 wherein the gain equalizer comprises a divider for dividing the phase difference signal by the signal strength indicator.

27. The phaselocked loop of claim 22 further comprising a first amplifier for receiving and amplifying the input data signal.

28. The phaselocked loop of claim 27 wherein the first amplifier comprises a linear amplifier.

29. The phaselocked loop of claim 22 further comprising a filter for filtering the phase difference signal to control dynamic performance of the phaselocked loop.

30. A method for recovering a clock signal from an input data signal comprising:
- receiving an input data signal at a primary phase detector, and combining the input data signal with a feedback signal to generate a phase difference signal;
- receiving the input data signal at an auxiliary phase detector, and combining the input data signal with the feedback signal to generate a signal strength indicator that is a function of the amplitude of the input data signal;
- normalizing the phase difference signal by the signal strength indicator at a gain equalizer; and
- providing the clock signal at an oscillator based on the normalized phase difference signal, and providing the clock signal as the feedback signal.

31. The method of claim 30 further comprising receiving and amplifying the input data signal at a first amplifier.

32. The method of claim 31 wherein the first amplifier comprises a linear amplifier.

33. The method of claim 30 wherein the input data signal is a return-to-zero (RZ) signal.

34. The method of claim 30 distributing the input data signal to the primary and auxiliary phase detectors at a first splitter.

35. The method of claim 34 wherein the first splitter is a 3 dB splitter.

36. The method of claim 30 further comprising distributing the feedback signal to the primary and auxiliary phase detectors at a second splitter.

37. The method of claim 36 wherein the second splitter is a 3 dB splitter.

38. The method of claim 30 further comprising filtering the phase difference signal to control dynamic performance of the clock recovery system.

39. The method of claim 30 further comprising compensating for temperature variance in the system.

40. The method of claim 39 further comprising adjusting the normalized signal phase output signal based on the temperature variance.

41. The method of claim 30 further comprising providing the recovered clock signal at an output.

42. The method of claim 41 further comprising distributing the recovered clock signal to the output as the clock signal and to the primary and auxiliary phase detectors as the feedback signal at a third splitter.

43. The method of claim 42 wherein the third splitter is a 3 dB splitter.

44. The method of claim 30 further comprising isolating an input of the third splitter and an output of the third splitter that provides the feedback signal, for isolating the system from load variations in a load coupled to the output, and for preventing corruption of the clock signal by the primary and auxiliary phase detectors.

45. The method of claim 30 wherein the gain equalizer comprises a divider for dividing the phase difference signal by the signal strength indicator.

46. The method of claim 45 wherein the divider generates a reciprocal of the signal strength indicator and multiplies the reciprocal of the signal strength indicator by the phase difference signal.

47. The method of claim 46 wherein the divider further multiplies the signal strength indicator or reciprocal of the signal strength indicator by a gain adjustment signal.

48. The method of claim 30 wherein the auxiliary phase detector comprises one of a harmonic mixer, or frequency doubler and mixer.

49. The method of claim 30 further comprising shifting the phase of the feedback signal to provide a phase-shifted feedback signal to the auxiliary phase detector.

50. The method of claim 30 further comprising distributing the signal strength indicator to other system components as an error signal.

51. A method for locking an output signal to an input signal in a phaselocked loop comprising:
- receiving an input signal at a primary phase detector, and combining the input signal with a feedback signal to generate a phase difference signal;
- normalizing the phase difference signal by a signal strength indicator generated as a function of the amplitude of the input signal; and
- providing the output signal at an oscillator based on the normalized phase difference signal, and providing the output signal as the feedback signal.

52. The method of claim 51 further comprising receiving the input data signal at an auxiliary phase detector, and mixing the input data signal with the feedback signal to generate the signal strength indicator.

53. The method of claim 52 wherein the auxiliary phase detector comprises one of a harmonic mixer, or frequency doubler and mixer.

54. The method of claim 51 further comprising shifting the phase of the feedback signal to provide a phase-shifted feedback signal to the auxiliary phase detector.

55. The method of claim 51 wherein normalizing further comprises dividing the phase difference signal by the signal strength indicator.

56. The method of claim 51 further comprising receiving and amplifying the input data signal at a first amplifier.

57. The method of claim 56 wherein the first amplifier comprises a linear amplifier.

58. The method of claim 51 further filtering the phase difference signal to control dynamic performance of the phaselocked loop.

59. A clock recovery system for recovering a clock signal from an input data signal comprising:
- a primary phase detector for receiving an input data signal, and for combining the input data signal transmitted at a carrier band rate with a feedback signal to generate a phase difference signal;
- an auxiliary phase detector for receiving the input data signal, and for combining the input data signal with the feedback signal to generate a signal strength indicator that is a function of the amplitude of the input data signal;
- a gain equalizer for normalizing the phase difference signal by the signal strength indicator, wherein the normalizing is conducted at a baseband rate of the carrier band rate; and
- an oscillator for providing the clock signal based on the normalized phase difference signal, and for providing the clock signal as the feedback signal.

60. The system of claim 59 further comprising a first amplifier for receiving and amplifying the input data signal.

61. The system of claim 60 wherein the first amplifier comprises a linear amplifier.

62. The system of claim 59 further comprising a filter for filtering the phase difference signal to control dynamic performance of the clock recovery system, wherein the filtering is conducted at the baseband rate.

63. The system of claim 59 wherein the gain equalizer comprises a divider for dividing the phase difference signal by the signal strength indicator.

64. The system of claim 63 wherein the divider comprises a reciprocal unit for generating a reciprocal of the signal strength indicator and a first multiplier for multiplying the reciprocal of the signal strength indicator by the phase difference signal.

65. The system of claim 64 wherein the divider further comprises a second multiplier for multiplying the signal strength indicator or reciprocal of the signal strength indicator by a gain adjustment signal.

66. The system of claim 59 further comprising a phase shifter for shifting the phase of the feedback signal to provide a phase-shifted feedback signal to the auxiliary phase detector.

67. A method for recovering a clock signal from an input data signal comprising:

receiving, at a carrier band rate, an input data signal at a primary phase detector, and combining the input data signal with a feedback signal to generate a phase difference signal;

receiving the input data signal at an auxiliary phase detector, and combining the input data signal with the feedback signal to generate a signal strength indicator that is a function of the amplitude of the input data signal;

normalizing, at a baseband rate of the carrier band rate, the phase difference signal by the signal strength indicator at a gain equalizer; and providing the clock signal at an oscillator based on the normalized phase difference signal, and providing the clack signal as the feedback signal.

68. The method of claim 67 further comprising receiving and amplifying the input data signal at a first amplifier.

69. The method of claim 68 wherein the first amplifier comprises a linear amplifier.

70. The method of claim 67 further comprising filtering, at the baseband rate, the phase difference signal to control dynamic performance of the clock recovery system.

71. The method of claim 67 wherein the gain equalizer comprises a divider for dividing the phase difference signal by the signal strength indicator.

72. The method of claim 71 wherein the divider generates a reciprocal of the signal strength indicator and multiplies the reciprocal of the signal strength indicator by the phase difference signal.

73. The method of claim 72 wherein the divider further multiplies the signal strength indicator or reciprocal of the signal strength indicator by a gain adjustment signal.

74. The method of claim 67 further comprising shifting the phase of the feedback signal to provide a phase-shifted feedback signal to the auxiliary phase detector.

* * * * *

UNITED STATES PATENT AND TRADEMARK OFFICE
CERTIFICATE OF CORRECTION

PATENT NO. : 6,617,932 B2
DATED : September 9, 2003
INVENTOR(S) : Lawrence J. Kushner et al.

It is certified that error appears in the above-identified patent and that said Letters Patent is hereby corrected as shown below:

Column 10,
Line 18, delete "input" and insert -- output --.
Line 58, delete "bused" and insert -- based --.

Column 14,
Line 10, delete "clack" and insert -- clock --.

Signed and Sealed this

Twenty-fifth Day of October, 2005

JON W. DUDAS
*Director of the United States Patent and Trademark Office*